(12) United States Patent
Fischer et al.

(10) Patent No.: US 10,955,759 B2
(45) Date of Patent: Mar. 23, 2021

(54) LITHOGRAPHIC APPARATUS AND DEVICE MANUFACTURING METHOD

(71) Applicant: ASML Netherlands B.V., Veldhoven (NL)

(72) Inventors: Olof Martinus Josephus Fischer, Veldhoven (NL); Hendrikus Herman Marie Cox, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 68 days.

(21) Appl. No.: 16/308,223

(22) PCT Filed: May 5, 2017

(86) PCT No.: PCT/EP2017/060741
§ 371 (c)(1),
(2) Date: Dec. 7, 2018

(87) PCT Pub. No.: WO2017/211510
PCT Pub. Date: Dec. 14, 2017

(65) Prior Publication Data
US 2019/0258181 A1    Aug. 22, 2019

(30) Foreign Application Priority Data

Jun. 9, 2016 (EP) .................... 16173627

(51) Int. Cl.
| | | |
|---|---|---|
| *H02K 41/03* | (2006.01) | |
| *G03F 7/20* | (2006.01) | |
| *H02K 41/035* | (2006.01) | |

(52) U.S. Cl.
CPC ....... *G03F 7/70758* (2013.01); *H02K 41/031* (2013.01); *H02K 41/0358* (2013.01); *H02K 2201/18* (2013.01); *H02K 2213/03* (2013.01)

(58) Field of Classification Search
CPC .............. G03F 7/70758; H02K 41/031; H02K 2201/18; H02K 2213/03
(Continued)

(56) References Cited

U.S. PATENT DOCUMENTS

| | | |
|---|---|---|
| 5,260,618 A | 11/1993 | Dunfield et al. |
| 5,459,362 A | 10/1995 | Dunfield et al. |

(Continued)

FOREIGN PATENT DOCUMENTS

| | | |
|---|---|---|
| EP | 2882082 A1 | 6/2015 |
| JP | S53-67818 A | 6/1978 |

(Continued)

OTHER PUBLICATIONS https://en.wikipedia.org/wiki/Magnet Accessed Dec. 10, 2020 (Year: 2020).*

(Continued)

*Primary Examiner* — Burton S Mullins
(74) *Attorney, Agent, or Firm* — DiBerardino McGovern IP Group LLC

(57) ABSTRACT

An electromagnetic actuator is described the actuator comprising:
  a magnet assembly comprising:
  an array of permanent magnets arranged in a first direction and configured to generate, outside the magnet assembly, a spatially varying magnetic field distribution in the first direction;
  a ferromagnetic member onto which the array of permanent magnets is mounted;
  a coil assembly, at least partly arranged in the spatially varying magnetic field distribution, configured to cooperate with the magnet assembly to generate an electromagnetic force;
wherein a thickness of the array of permanent magnets in a second direction perpendicular to the first direction varies (Continued)

along the first direction and wherein a thickness of the ferromagnetic member in the second direction varies along the first direction such that a combined thickness of the array of permanent magnets and the ferromagnetic member in the second direction is substantially constant along the first direction.

23 Claims, 11 Drawing Sheets

(58) Field of Classification Search
USPC .................................................... 310/12.06
See application file for complete search history.

(56) References Cited

U.S. PATENT DOCUMENTS

| | | | |
|---|---|---|---|
| 6,188,147 B1 | 2/2001 | Hazelton et al. | |
| 6,445,093 B1* | 9/2002 | Binnard | G03F 7/70716 |
| | | | 250/491.1 |
| 6,737,662 B2* | 5/2004 | Mulder | G03F 7/70116 |
| | | | 250/548 |
| 7,368,838 B2* | 5/2008 | Binnard | H02K 41/0356 |
| | | | 310/15 |
| 7,541,699 B2* | 6/2009 | Dams | G03F 7/70758 |
| | | | 310/12.06 |
| 7,989,993 B1 | 8/2011 | Li et al. | |
| 2003/0052548 A1 | 3/2003 | Hol et al. | |
| 2004/0239194 A1 | 12/2004 | Thirunarayan et al. | |
| 2005/0077786 A1 | 4/2005 | De Weerdt | |
| 2006/0072098 A1 | 4/2006 | Dams | |
| 2006/0082753 A1* | 4/2006 | Cox | G03F 7/70758 |
| | | | 355/72 |
| 2007/0145831 A1 | 6/2007 | Antonius Theodorus Dams | |
| 2010/0090545 A1 | 4/2010 | Binnard et al. | |
| 2012/0161551 A1* | 6/2012 | Miyamoto | H02K 1/246 |
| | | | 310/46 |
| 2015/0137624 A1* | 5/2015 | Wu | H02K 41/031 |
| | | | 310/12.05 |

FOREIGN PATENT DOCUMENTS

| | | |
|---|---|---|
| JP | H10898500 A | 4/1996 |
| JP | 2001145328 A | 5/2001 |
| JP | 2005117049 A | 4/2005 |
| JP | 2006121069 A | 5/2006 |
| JP | 2006230127 A | 8/2006 |
| JP | 2007019127 A | 1/2007 |
| JP | 2007110822 A | 4/2007 |
| JP | 2007251128 A | 9/2007 |
| JP | 4811785 B2 | 9/2011 |
| JP | 1811785 B2 | 11/2011 |
| JP | 2012505622 A | 3/2012 |
| JP | 5015316 B2 | 6/2012 |

OTHER PUBLICATIONS

He Zhang et al., "A Three-Degree-of-Freedom Short-Stroke Lorentz-Force-Driven Planar Motor Using a Halbach Permanent-Magnet Array With Unequal Thickness," IEEE Transactions on Industrial Electronics, XP011580655, vol. 62, No. 6, Jun. 2015, pp. 3640-3650, 11 total pages.

Hervé Le Chenadec, European International Searching Authority, International Search Report, counterpart PCT Application No. PCT/EP2017/060741, dated Aug. 4, 2017, 4 pages total.

Hervé Le Chenadec, European International Searching Authority, Written Opinion, counterpart PCT Application No. PCT/EP2017/060741, dated Aug. 4, 2017, 6 pages total.

Office Action, counterpart Japanese Patent Application No. 2018-560196, dated Nov. 18, 2019, 14 pages total (including English translation of 8 pages).

Office Action, Akihiro Sato, Second Patent Examination Department, Japan Patent Office, counterpart Japanese Patent Application No. 2018-560196, dated May 1, 2020, 15 pages total (including English translation of 8 pages).

Office Action, Akihiro Sato, Second Patent Examination Department, Japan Patent Office, counterpart Japanese Patent Application No. 2018-560196, dated Nov. 30, 2020, 17 pages total (including English translation of 10 pages).

* cited by examiner

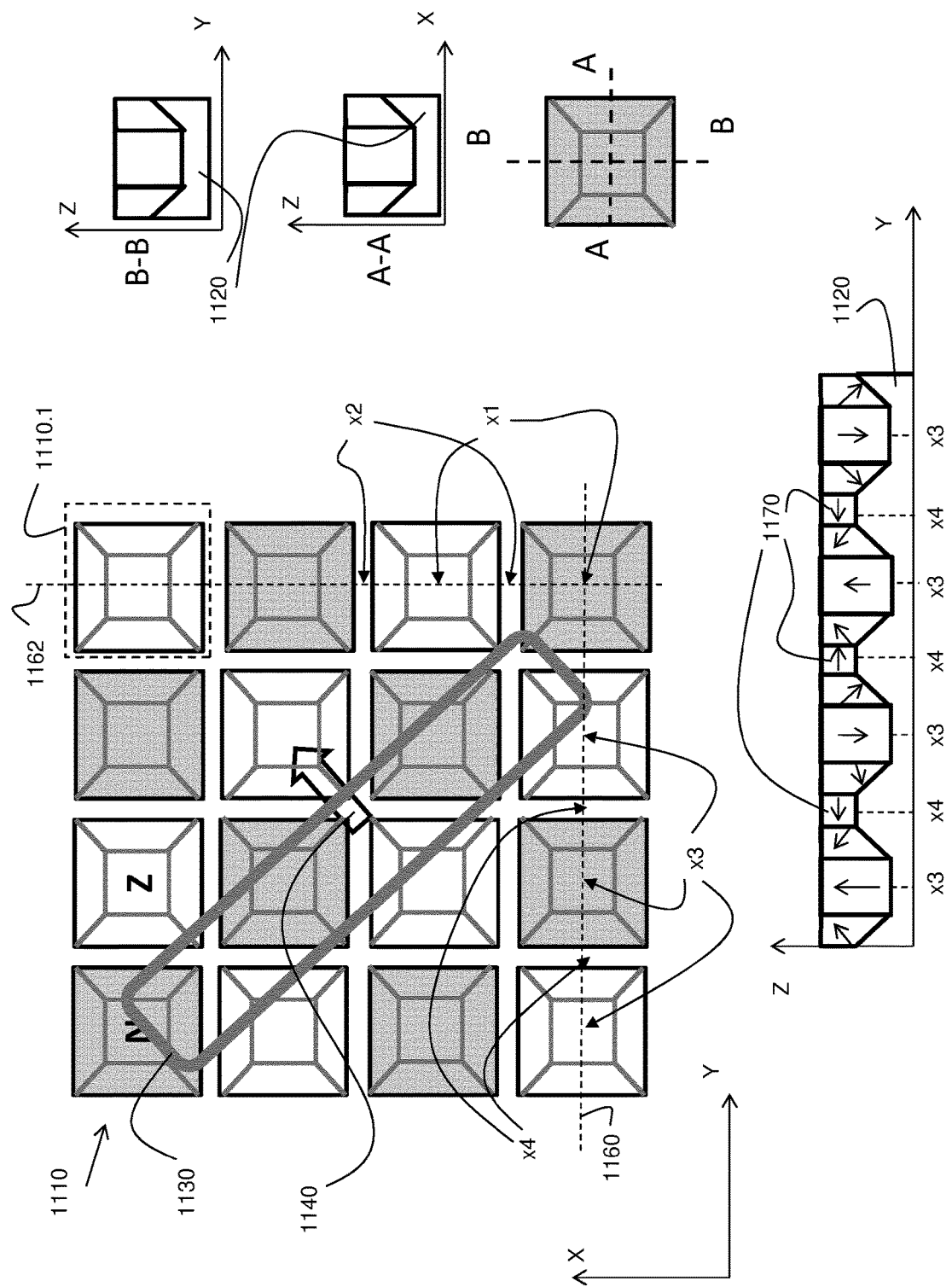

LITHOGRAPHIC APPARATUS AND DEVICE MANUFACTURING METHOD

CROSS-REFERENCE TO RELATED APPLICATIONS

This application claims priority of EP application 16173627.7 which was filed on Jun. 9, 2016 and which is incorporated herein in its entirety by reference.

FIELD OF THE INVENTION

The present invention relates to an electromagnetic actuator, an electromagnetic motor and a lithographic apparatus.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. In order to accurately position the patterning device relative to the substrate, a lithographic apparatus typically comprises a plurality of actuators and motors (e.g. electromagnetic actuators and motors).

SUMMARY

It is desirable to improve the performance of an electromagnetic actuator or motor.

According to an aspect of the invention, there is provided an electromagnetic actuator comprising:
  a magnet assembly comprising:
    an array of permanent magnets arranged in a first direction and configured to generate, outside the magnet assembly, a spatially varying magnetic field distribution in the first direction;
    a ferromagnetic member onto which the array of permanent magnets is mounted;
  a coil assembly, at least partly arranged in the spatially varying magnetic field distribution, configured to cooperate with the magnet assembly to generate an electromagnetic force;
wherein a thickness of the array of permanent magnets in a second direction perpendicular to the first direction varies along the first direction between a minimum magnet thickness at one or more first positions along the first direction and a maximum magnet thickness at one or more second positions along the first direction and wherein a thickness of the ferromagnetic member in the second direction varies along the first direction between a minimum member thickness at the one or more second positions and a maximum member thickness at the one or more first positions, whereby the sum of the maximum magnet thickness and the minimum member thickness at the one or more second positions is smaller than or equal to the sum of the minimum magnet thickness and the maximum member thickness at the one or more first positions.

According to another aspect of the present invention, there is provided an electromagnetic linear motor comprising:
  a magnet assembly comprising:
    an array of permanent magnets arranged in a first direction and configured to generate, outside the magnet assembly, a spatially varying magnetic field distribution in the first direction;
    a ferromagnetic member onto which the array of permanent magnets is mounted;
  a coil assembly, at least partly arranged in the spatially varying magnetic field distribution, configured to cooperate with the magnet assembly to generate an electromagnetic force, the coil assembly comprising a plurality of coils arranged in the first direction and configured to be powered by a multiphase power supply; wherein a thickness of the array of permanent magnets in a second direction perpendicular to the first direction varies along the first direction between a minimum magnet thickness at one or more first positions along the first direction and a maximum magnet thickness at one or more second positions along the first direction and wherein a thickness of the ferromagnetic member in the second direction varies along the first direction between a minimum member thickness at the one or more second positions and a maximum member thickness at the one or more first positions, whereby the sum of the maximum magnet thickness and the minimum member thickness at the one or more second positions is smaller than or equal to the sum of the minimum magnet thickness and the maximum member thickness at the one or more first positions.

According to yet another aspect of the present invention there is provided an electromagnetic planar motor comprising:
  a magnet assembly comprising:
    a two-dimensional array of permanent magnets arranged in a first direction and in a second direction and configured to generate, outside the magnet assembly, a spatially varying magnetic field distribution in the first direction and in the second direction;
    a ferromagnetic member onto which the array of permanent magnets is mounted;
  a coil assembly, at least partly arranged in the spatially varying magnetic field distribution, configured to cooperate with the magnet assembly to generate a force, the coil assembly comprising:
    a first plurality of coils arranged in the first direction and configured to be powered by a first multiphase power supply;
    a second plurality of coils arranged in the second direction and configured to be powered by a second multiphase power supply
wherein a thickness of the two-dimensional array of permanent magnets in a third direction perpendicular to the first direction and to the second direction varies along the first direction between a minimum magnet thickness at one or more first positions along the first direction and a maximum magnet thickness at one or more second positions along the first direction;

wherein a thickness of the two-dimensional array of permanent magnets in the third direction varies along the second direction between the minimum magnet thickness at one or more third positions along the second direction and the maximum magnet thickness at one or more fourth positions along the second direction;

wherein a thickness of the ferromagnetic member in the third direction varies along the first direction between a minimum member thickness at the one or more second positions and a maximum member thickness at the one or more first positions, and wherein a thickness of the ferromagnetic member in the third direction varies along the second direction between a minimum member thickness at the one or more fourth positions and a maximum member thickness at the one or more third positions, whereby the sum of the maximum magnet thickness and the minimum member thickness at the one or more second positions is smaller than or equal to the sum of the minimum magnet thickness and the maximum member thickness at the one or more first positions and whereby the sum of the maximum magnet thickness and the minimum member thickness at the one or more fourth positions is smaller than or equal to the sum of the minimum magnet thickness and the maximum member thickness at the one or more third positions.

According to yet another aspect of the present invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the apparatus further comprises an actuator according to the invention or a motor according to the invention for positioning the support or the substrate table.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 11 depicts a top view of a planar motor according to the present invention.

DETAILED DESCRIPTION

Figure 1:
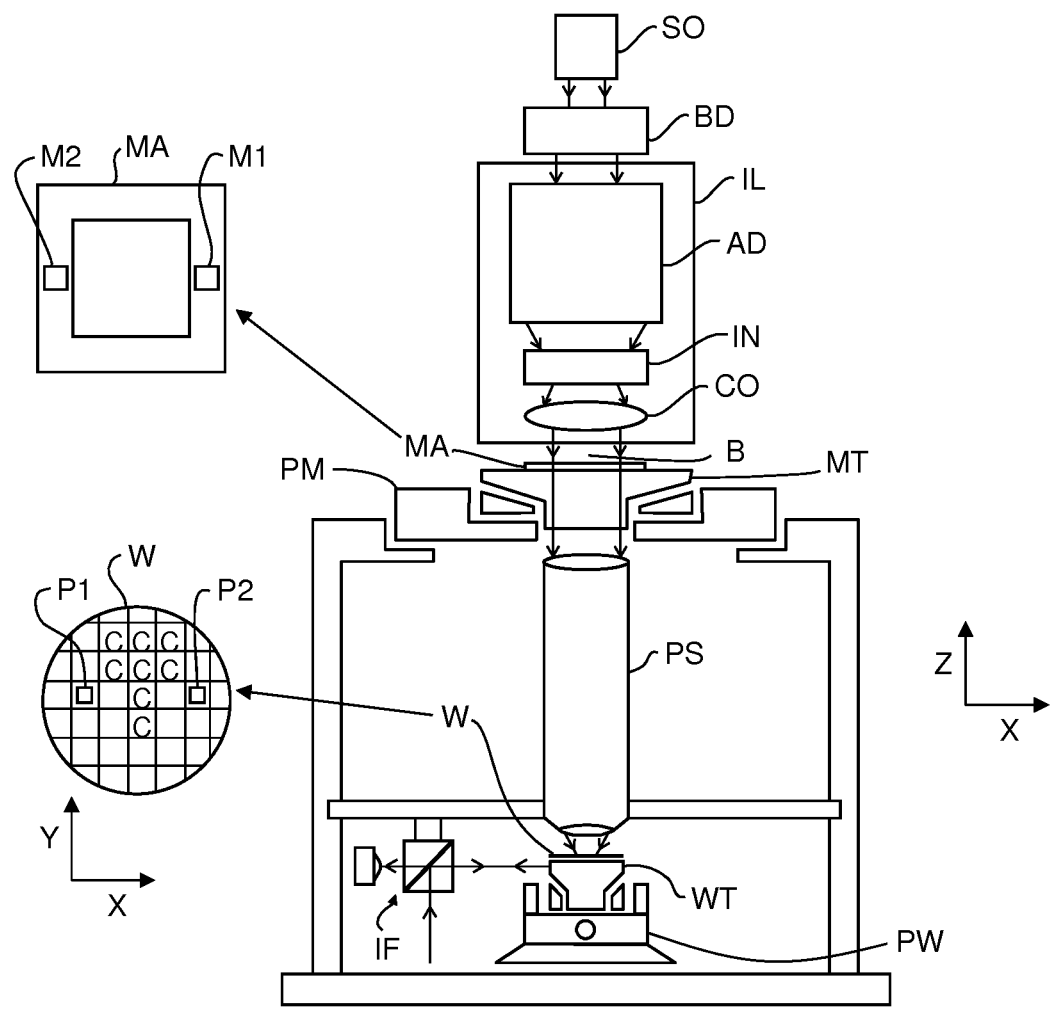
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW.

In an embodiment, the short-stroke module may comprise one or more electromagnetic actuators to accurately position the substrate table WT or the mask table MT. In an embodiment, the short-stroke module may comprise a plurality of electromagnetic actuators according to the present invention, so as to accurately position the substrate table WT or the mask table MT in 6 degrees of freedom (6 DOF). In addition or alternatively, the long-stroke module may comprise one or more linear or planar motors according to the present invention for coarse positioning of the s substrate table WT or the mask table MT.

In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The following Figures illustrate in more detail various embodiments of electromagnetic actuators or motors according to the present invention.

Figure 2:
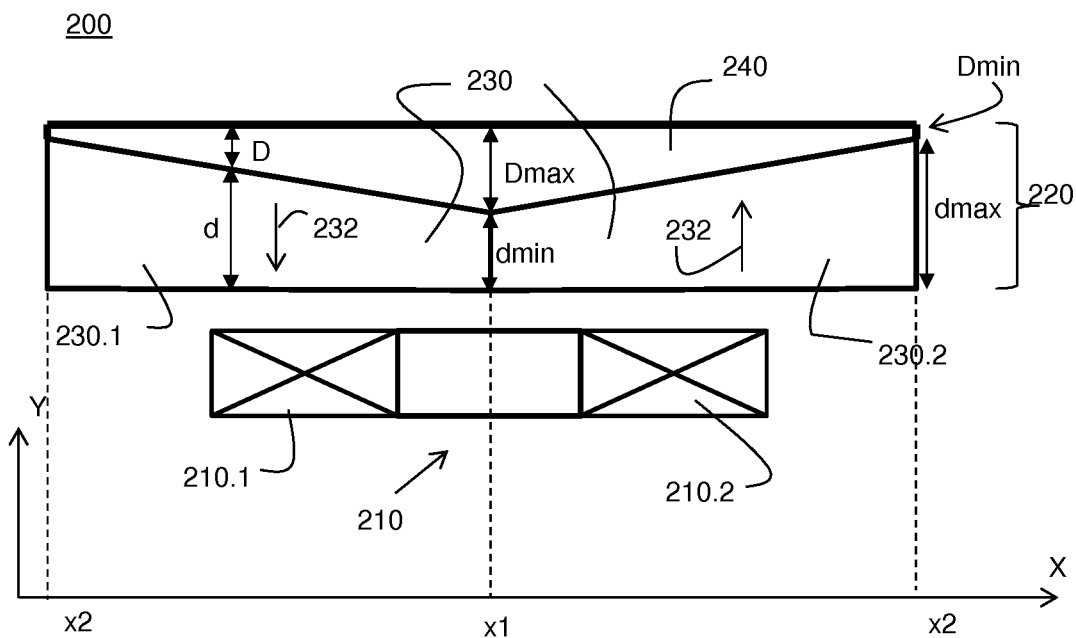
FIG. 2 depicts a cross-sectional view of a first embodiment of an actuator according to the invention.

FIG. 2 schematically shows a cross-sectional view of an electromagnetic actuator 200 according to an embodiment of the present invention. The electromagnetic actuator 200 comprises a coil assembly 210 and a magnet assembly 220. The magnet assembly 220 comprises an array of permanent magnets 230 that is arranged in a first direction, i.e. the X-direction as shown in FIG. 2, and is configured to generate a varying magnetic field distribution along said first direction. In the embodiment as shown, the array of permanent magnets 230 of the magnet assembly 220 comprises a pair of magnets 230.1 and 230.2 having an opposite magnetization direction (indicated by the arrows 232). In the embodiment as shown, the magnets 230.1 and 230.2 have a magnetization direction in the Y-direction; more specifically, the magnet 230.1 is magnetized in the −Y direction and the magnet 230.2 is magnetized in the Y-direction respectively. Note that other magnet arrangements having other magnetization directions may be applied as well to generate a varying magnetic field distribution along the first direction (X-direction), as will be illustrated below.

In accordance with the present invention, the array of permanent magnets 230 of the magnet assembly 220 has a thickness d in a second direction, i.e. the Y-direction perpendicular to the first direction, which varies along the first direction, i.e. the X-direction. Similarly, the thickness D, in the second direction, of the ferromagnetic member 240 of the magnet assembly also varies along the first direction. In the embodiment as shown, the thickness varies in such manner that the combined thickness of the ferromagnetic member and the array of magnets is substantially constant along the first direction. In general, in accordance with the present invention, a thickness of the array of permanent magnets in the second direction perpendicular to the first direction varies along the first direction between a minimum magnet thickness dmin at one or more first positions (e.g. position x1) along the first direction, i.e. the X-direction, and a maximum magnet thickness dmax at one or more second positions (e.g. positions x2) along the first direction and wherein a thickness of the ferromagnetic member in the second direction varies along the first direction between a minimum member thickness Dmin at the one or more second positions and a maximum member thickness Dmax at the one or more first positions, whereby the sum of the maximum magnet thickness and the minimum member thickness at the one or more second positions is smaller than or equal to the sum of the minimum magnet thickness and the maximum member thickness at the one or more first positions. Various magnet assemblies as can be applied in an electromagnetic actuator according to the present invention and fulfilling this requirement are illustrated below.

In the embodiment as shown, the thickness being defined in a direction perpendicular to a plane defined by an outer surface of the magnet array facing the coil assembly. In the embodiment as shown, the outer surface of the magnet array facing the coil assembly is substantially flat.

The coil assembly 210 as schematically shown comprises a coil having a first coil side 210.1 and a second coil side 210.2. Typically, a coil as applied in an actuator according to the present invention will have multiple windings, e.g. made of copper or aluminum. The coil assembly 210 as schematically shown in FIG. 2 is configured to interact with the magnet assembly 220, in order to generate a force. In particular, when the coil of the coil assembly 210 is provided with a current, a force will be generated due to the interaction of the current and the magnetic field distribution. In the cross-sectional view of FIG. 2, a current in the coil assembly 210 is assumed to flow in a direction substantially perpendicular to the XY-plane. The current in coil side 210.1 may e.g. flow inward, i.e. inward and perpendicular to the XY-plane of the drawing whereas the current in coil side 210.2 may flow outward, i.e. outward and perpendicular to the XY-plane of the drawing. In general, the direction of the generated force may depend on the relative position of the coil assembly and the magnet assembly, because the direction of the force as generated depends on the direction of the magnetic field as perceived by the current carrying conductors or windings of the coil or coils of the coil assembly. As an example, in case the magnetic field distribution as perceived by the current carrying conductors is substantially directed along the Y-direction, the force as generated by the actuator will be substantially directed along the X-direction.

Figure 3:
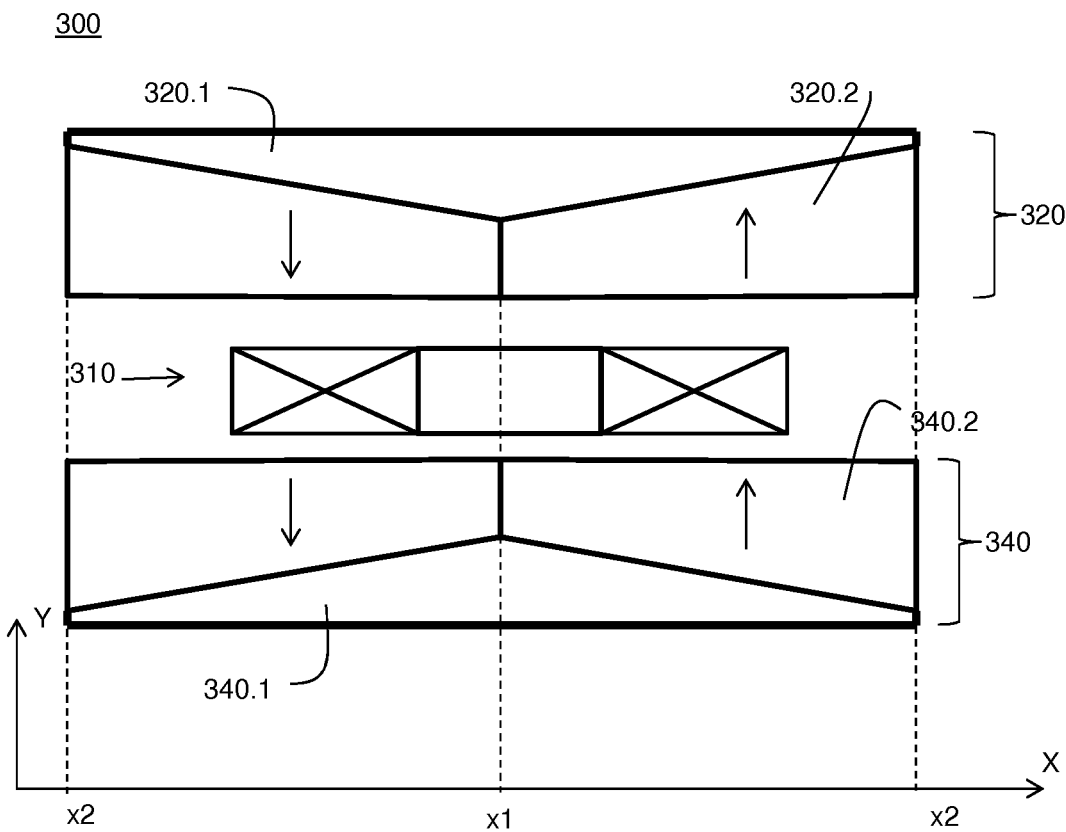
FIG. 3 depicts a cross-sectional view of a second embodiment of an actuator according to the invention.

In an embodiment of the present invention, the electromagnetic actuator comprises a further or second magnet assembly, the coil assembly at least partly being arranged in between both magnet assemblies. Such an arrangement is schematically shown in FIG. 3. The electromagnetic actuator 300 as shown in FIG. 3 comprises a first magnet assembly 320, having a similar structure as the magnet assembly 220 of FIG. 2, and a second magnet assembly 340, the first and second magnet assembly being configured to generate a spatially varying magnetic field distribution along a first direction, i.e. the X-direction. In the arrangement as shown, the magnet assemblies are arranged on opposite sides of a coil assembly 310 of the electromagnetic actuator. The coil assembly 310 as shown is arranged such that a current provided to the coil assembly 310 may interact with the magnetic field distribution as generated by the first and second magnet assemblies 320, 340. In the arrangement as shown, both magnet assemblies 320 and 340 comprise an array of permanent magnets 320.2, 340.2 of which the thickness (in the Y-direction) varies along the X-direction, the thickness having a maximum at positions x2 along the X-direction and a minimum at position x1. Both magnet assemblies also comprise a ferromagnetic member 320.1 340.1 of which the thickness (in the Y-direction) also varies along the X-direction, having a minimum at the positions x2 and a maximum at the position x1. In the embodiment as shown, the combined thickness of the array of permanent magnets and the ferromagnetic member of each magnet assembly is substantially constant along the first direction, i.e. the X-direction. Compared to the actuator as shown in FIG. 2, the electromagnetic actuator as shown in FIG. 3 may have an increase magnetic field distribution, thus enabling to generate a larger force per unit of current applied to the coil assembly. Such an arrangement may further, in addition to increasing the Y-component of the magnetic field distribution, reduce the X-component of the magnetic field distribution as perceived by the coil assembly. As described above, the magnet assembly or assemblies as applied in an electromagnetic actuator according to the present invention comprise an array of permanent magnets and a ferromagnetic member, both having a varying thickness. It can be pointed out that in general, the permanent magnets supply the magnetic flux and the ferromagnetic member only guides the magnetic flux. So increasing the amounts of magnets relative to the ferromagnetic member results typically in more magnetic flux and thus larger actuator forces. In accordance with the invention, by varying the thickness of both the array of permanent magnets and the ferromagnetic member, a more effective use of both the permanent magnets and the ferromagnetic member is made, resulting in an increased performance of the actuator, e.g. an increased force per unit current, or an increased flux density or magnetic field strength as perceived by the coil assembly, or a reduced weight of the magnet assembly while maintaining the force per unit current substantially the same. In accordance with the present invention, this is realized by varying the thickness of the permanent magnets and the ferromagnetic member according to the following:

In a magnet assembly as applied in an electromagnetic actuator as e.g. shown in FIGS. 2 and 3, the ferromagnetic member serves as a guiding means for the magnetic flux generated by the array of permanent magnets. Ferromagnetic members, e.g. made from carbon steel, laminated steel or CoFe alloys or the like, have a high permeability up to a certain flux density, referred to a the magnetic saturation level. When a permanent magnet array is configured to generate a spatially varying magnetic field distribution, e.g. along the X-direction shown in FIG. 2 or 3, the flux density in the ferromagnetic member will vary as well along said X-direction.

Figure 4:
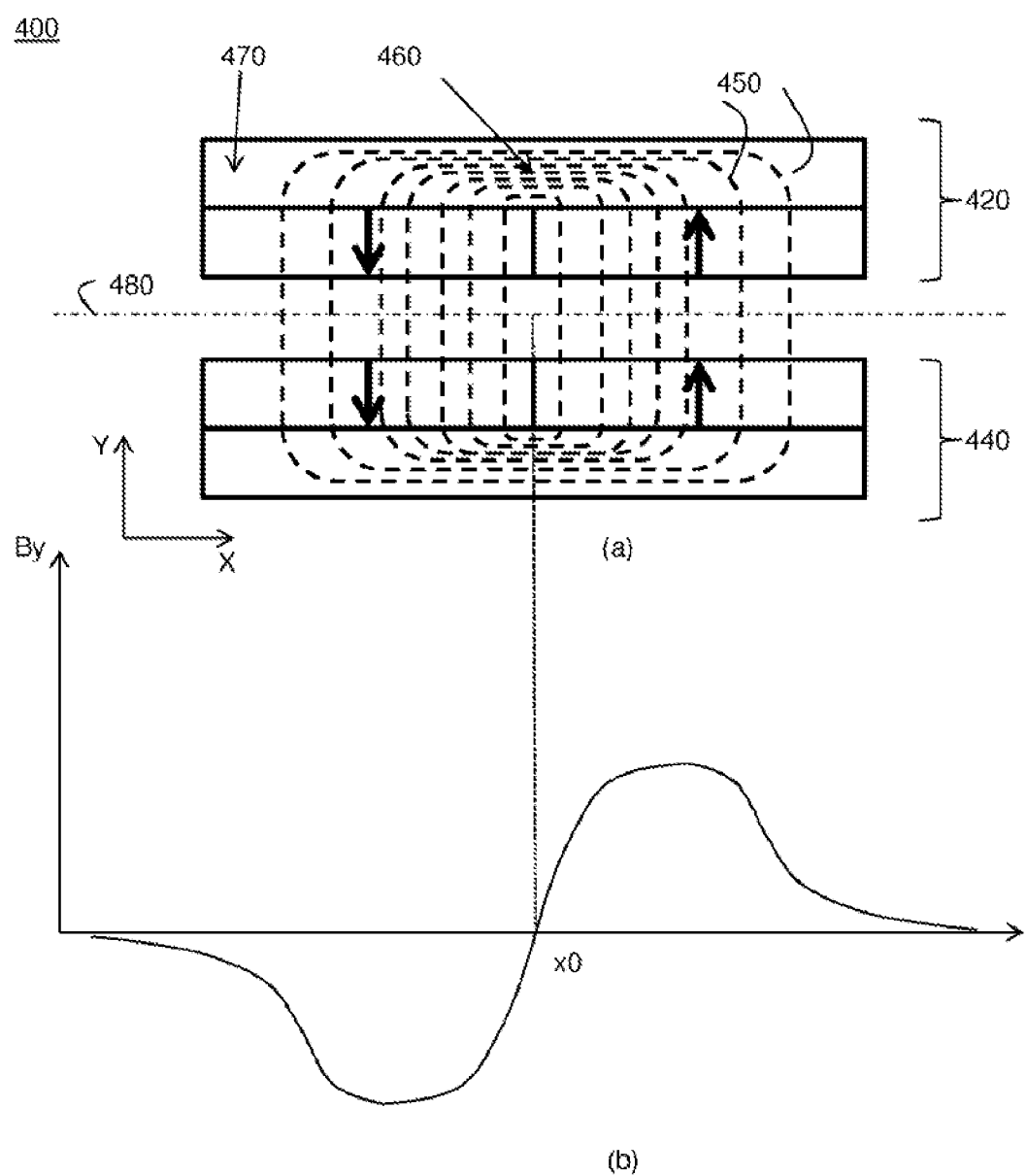
FIG. 4 depicts a magnetic field distribution of an actuator as known in the art.

FIG. 4 highly schematically shows the magnetic field distribution, indicated by the dotted magnetic flux lines 450, for a conventional actuator 400 having a first magnet assembly 420 and a second magnet assembly 440, each magnet assembly 420, 440 having a pair of oppositely magnetized permanent magnets (indicated by the arrows) mounted on a ferromagnetic member 420.1, 440.1 respectively. As can be seen, The magnetic flux generated by the permanent magnets, indicated by the contours 450, is guided by the ferromagnetic members 420.1 and 440.1. It can further be observed that the magnetic field strength in the ferromagnetic member is not constant; the magnetic field strength can be considered to be proportional to the density of the magnetic flux contours. As such, one can observe that the magnetic field strength or flux density at location 460 is higher than at location 470. In the region between both magnet assemblies, where, during us, a coil assembly is to be positioned, one can also observe a variation of the magnetic field strength. Graph (b) of FIG. 4 schematically shows the magnetic field distribution, in particular the magnetic field strength By in the Y-direction along the line 480 as indicated. As can be observed, the magnetic field strength in the area between the magnet assemblies varies along the X-direction and is substantially equal to zero at a position x0 along the X-direction. At the same position x0, the flux density in the ferromagnetic members is at its maximum.

In order to avoid or mitigate a high magnetic field strength occurring at certain locations in the ferromagnetic members, it has been proposed in the past to increase the thickness of the members at those locations and reduced the thickness at other locations, there leaving the magnet assembly unaltered. Such an approach has been found to be less than optimal in that it can result in an increased thickness of the actuator as a whole, thus increasing the volume and mass occupied by the actuator.

It has been found by the inventors that a more favorable approach is to increase, at locations having a high flux density, the thickness of the ferromagnetic member while at the same time reduce the thickness of the permanent magnet array, e.g. with the same amount. At locations where the flux density is low, the thickness of the ferromagnetic member is reduced and, at the same time, the thickness of the permanent magnet array may be increased, e.g. with the same amount. Preferably, these thickness modifications are implemented at the interface surface of the ferromagnetic member and the array of permanent magnets; i.e. the surface of the ferromagnetic member onto which the permanent magnets are mounted.

In view of the above, one can also conclude that it is preferred to have a maximum thickness for the ferromagnetic member at a location along the first direction where the highest flux density is to be expected, i.e. where the spatially varying magnetic field distribution outside the magnet assembly is substantially zero.

Figure 5:
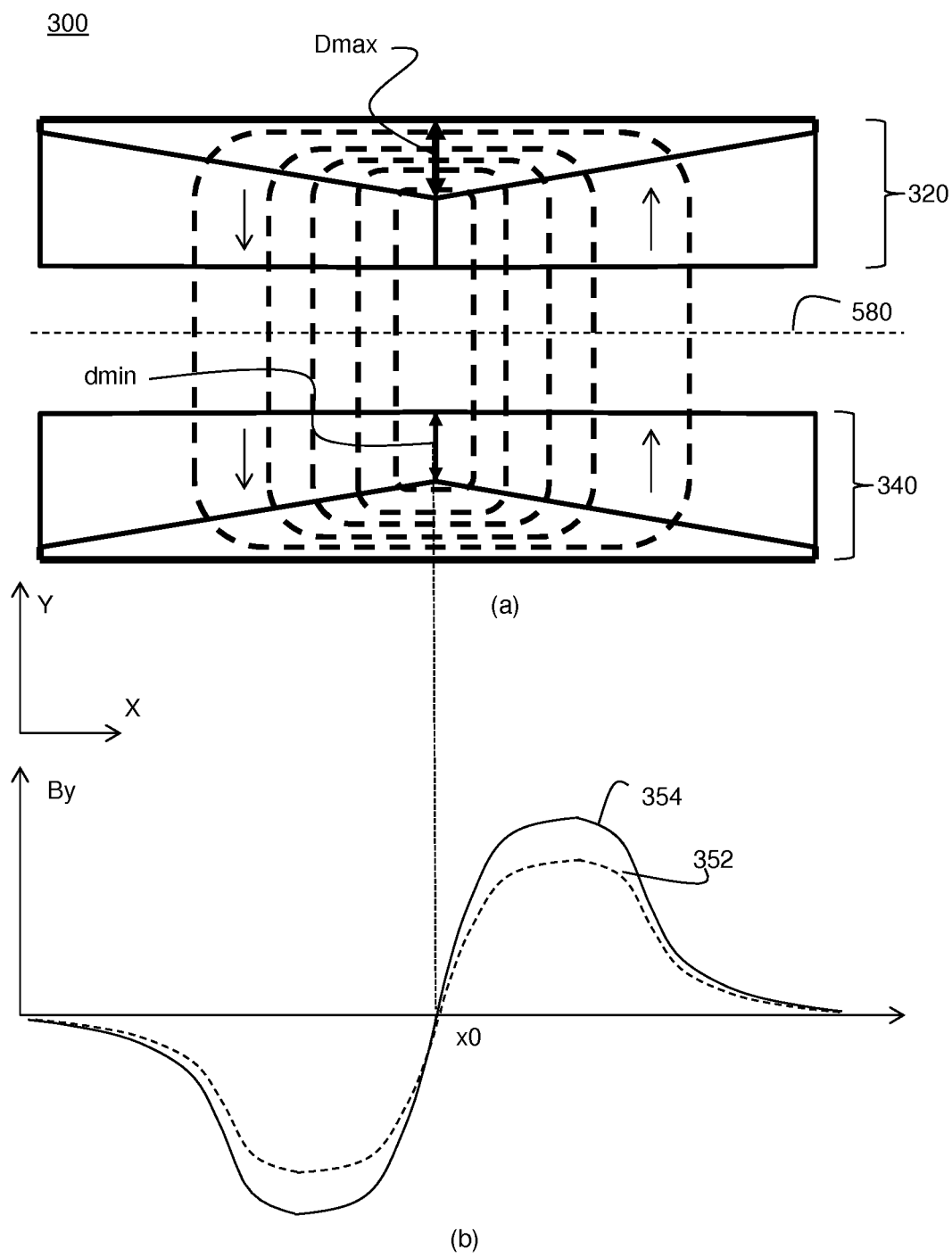
FIG. 5 depicts a magnetic field distribution of an actuator according to the present invention.

This is schematically illustrated in FIG. 5. FIG. 5 schematically shows the magnet assemblies of the actuator 300 of FIG. 3, and contours 350 indicating the magnetic flux distribution. In the embodiment as shown, the ferromagnetic members 320.1 and 340.1 have a maximum thickness Dmax where the highest flux density is to be expected, this position, along the X-direction corresponding to the position where the magnetic field distribution outside the magnet assemblies, i.e. in the area between the magnet assemblies, is substantially zero. Graph (b) of FIG. 5 schematically shows the magnetic field distribution By(x), in particular the magnetic field strength By in the Y-direction along the line 580 as indicated, both for a conventional actuator, graph 352 and for an actuator according to the present invention, graph 354. It can be pointed out that the use of a magnet assembly as defined by the present invention provides in an increased flux density distribution, substantially without altering the shape of the flux distribution. As may further be observed, the magnetic field strength in the area between the magnet assemblies varies along the X-direction and is substantially equal to zero at a position x0 along the X-direction. At the same position x0, the flux density in the ferromagnetic members is at its maximum.

As such, in an embodiment of the present invention, the one or more first positions (e.g. positions x1 as schematically shown in FIGS. 2 and 3), where the thickness of the ferromagnetic member is at a maximum (Dmax) and the thickness of the permanent magnet array is at a minimum (dmin), substantially coincide with the position or positions x0 where the spatially varying magnetic field distribution outside the magnet assembly is substantially zero.

In the embodiments as shown in FIGS. 2, 3 and 5, the arrays of permanent magnets as applied each consist of a pair of permanent magnets with a magnetization direction or magnetic polarization in the second direction, i.e. the Y-direction.

Figure 6A:
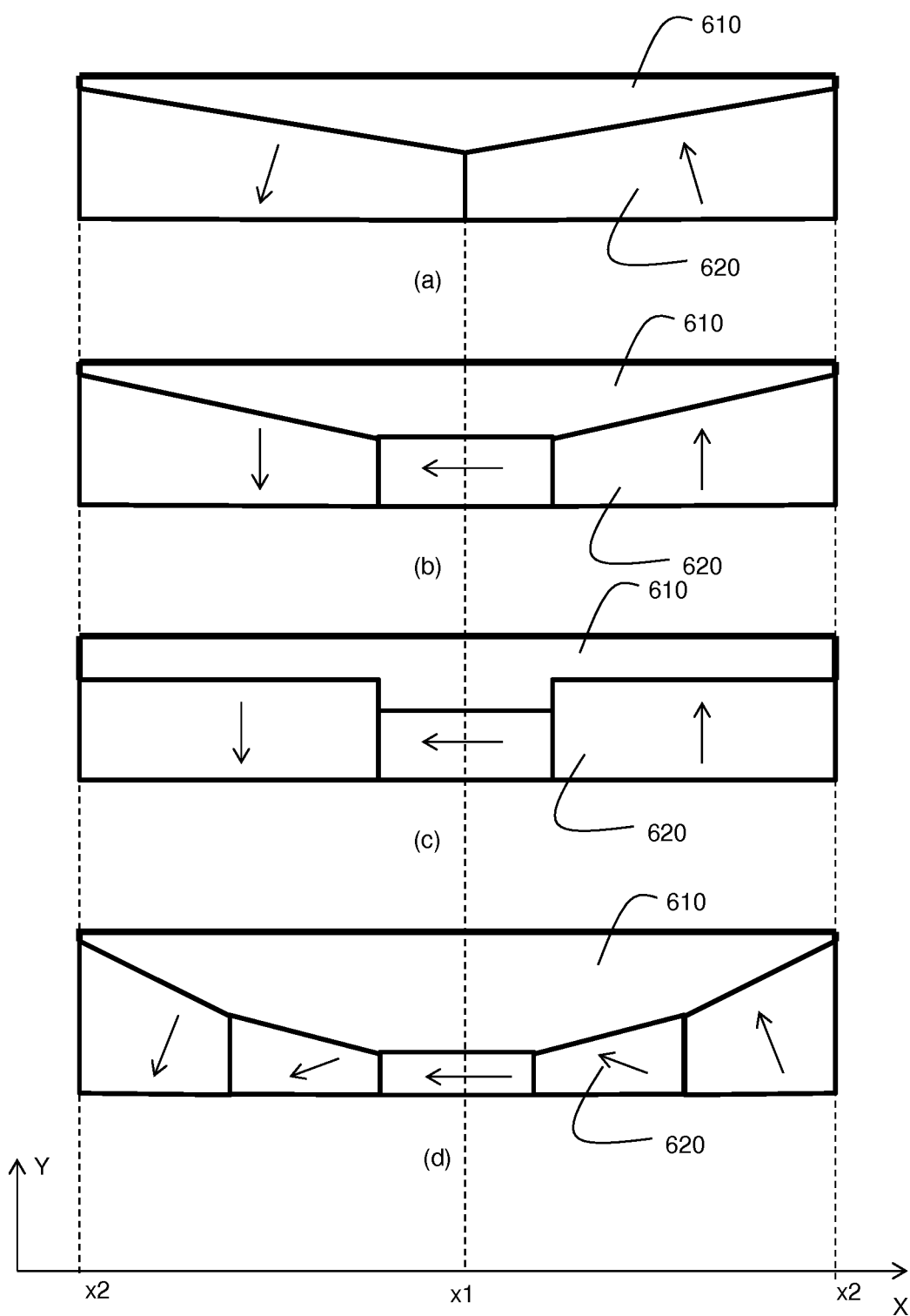
FIGS. 6a(a)-6a(d) and 6b(a)-6b(d) each depict 4 alternative magnet assemblies for an actuator according to the invention.

FIG. 6a schematically shows several alternative magnet assemblies which can be applied in an electromagnetic actuator according to the present invention, the magnet assemblies having a ferromagnetic member 610 and an array of permanent magnets 620.

FIG. 6a schematically shows 4 alternative magnet assemblies:

Alternative (a) has similar structure as the magnet assemblies 220 and 320, but a different magnetization direction, to illustrate that the magnetization direction need not be along the second direction, In alternatives (b), (c), (d), one or more additional magnets are applied. These alternatives can be considered, with respect to the applied magnetization directions, examples of what is known as a Halbach array. A Halbach array of permanent magnets is referred to in literature as an array of permanent magnets, whereby the permanent magnets of the array have a spatially rotating pattern of magnetization. In the embodiments as shown, a combined thickness of the array of permanent magnets and the ferromagnetic members in a second direction, the Y-direction is substantially constant along the first direction, the X-direction. In the embodiments as shown, a thickness of the array of permanent magnets 620, in the Y-direction, varies along the X-direction between a minimum magnet thickness at a first position x1 and a maximum magnet thickness at second positions x2 along the first direction and a thickness of the ferromagnetic member in the Y-direction varies along the X-direction between a minimum member thickness at the second positions x2 and a maximum member thickness at the first position x1, whereby the sum of the maximum magnet thickness and the minimum member thickness at the second positions x2 is substantially equal to the sum of the minimum magnet thickness and the maximum member thickness at the first position x1. Or, the increase in thickness of the ferromagnetic member 610 between the second position x2 and the first position x1 substantially matches the decrease in thickness of the permanent magnet array 620 between the second position x2 and the first position x1.

Figure 6B:
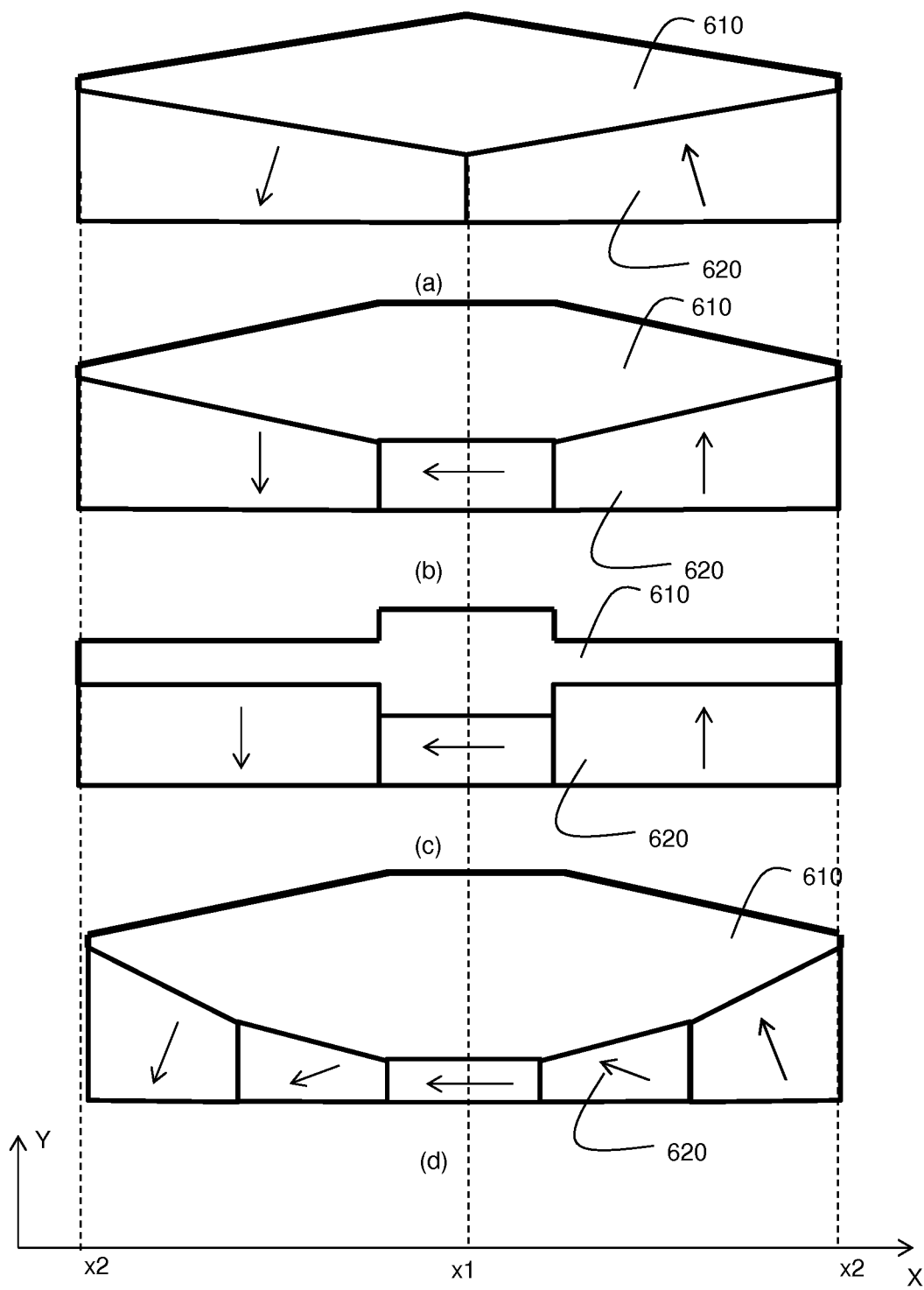

FIG. 6*b* schematically shows several alternative magnet assemblies which can be applied in an electromagnetic actuator according to the present invention, the magnet assemblies having a ferromagnetic member 610 and an array of permanent magnets 620, whereby a thickness of the array of permanent magnets 620, in the Y-direction, varies along the X-direction between a minimum magnet thickness at a first position x1 and a maximum magnet thickness at second positions x2 along the first direction and a thickness of the ferromagnetic member in the Y-direction varies along the X-direction between a minimum member thickness at the second positions x2 and a maximum member thickness at the first position x1, whereby the sum of the maximum magnet thickness and the minimum member thickness at the second positions x2 is smaller then the sum of the minimum magnet thickness and the maximum member thickness at the first position x1. Or, the increase in thickness of the ferromagnetic member 610 between the second position x2 and the first position x1 is larger than the decrease in thickness of the permanent magnet array 620 between the second position x2 and the first position x1.

Figure 7:
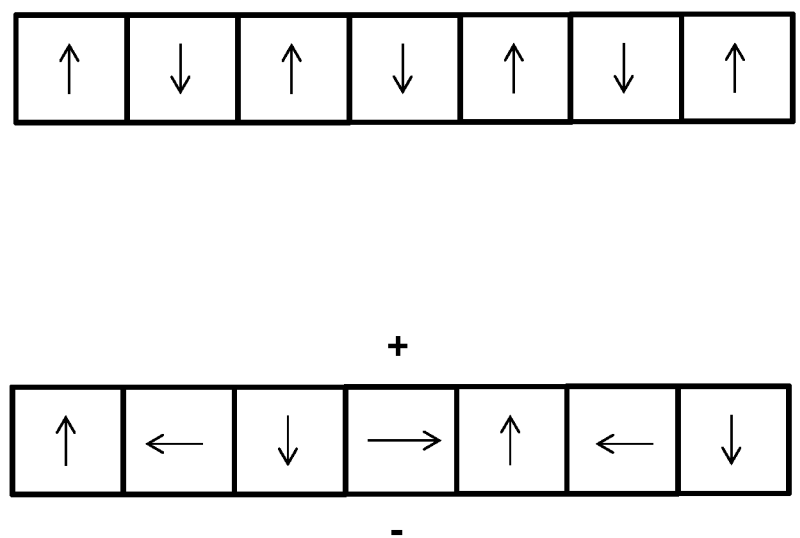
FIG. 7 depicts a conventional magnet array and a Halbach array.

FIG. 7 schematically shows a conventional array of magnets (having a spatially alternating pattern of magnetization) and a Halbach array of magnets. In the magnet array shown at the top of FIG. 7, the permanent magnets 700 are alternatingly polarized, i.e. a difference in magnetization direction between adjacent magnets is 180°. In the Halbach array shown at the bottom of FIG. 7, the difference in magnetization direction between adjacent magnets is 90°. Compared to a conventional array of magnets, the Halbach array of magnets results in an increased magnetic field on one side of the array (indicated by the + sign) and a decreased magnetic field on the other opposing side of the array (indicated by the − sign). Typically the addition of Halbach magnets may increase the flux density by 10-20%.

Note that the difference in magnetization direction between adjacent magnets need not be 90°, alternative values such as 45° or 30° may be applied as well. In an embodiment of the present invention, the difference in magnetization direction between adjacent magnets in the array of permanent magnets is 90° or less, preferably 45° or less. In the alternative magnet assemblies (b), (c) and (d) shown in FIGS. 6*a* and 6*b*, the permanent magnet arrays all have a permanent magnet having a magnetization direction in the first direction.

Because this magnet is typically location at a position along the first direction where the flux density in the ferromagnetic member would be the highest (e.g. position x0 as indicated in FIGS. 4 and 5), it is preferred to provide this magnet with the smallest thickness, i.e. the minimal magnet thickness.

In the embodiments as shown in FIGS. 2, 3, 5 and 6*a* and 6*b*, the thickness of the magnets and of the ferromagnetic member varies along the first direction in a piecewise linear manner. Such an approach may provide advantages with respect to manufacturability but is not an absolute requirement for the present invention. Also, as can be seen from alternative (c) in FIGS. 6*a* and 6*b*, the thickness variation along the first direction need not be continuous but may be discontinuous.

In the embodiments of the electromagnetic actuator according to the present invention as shown in FIGS. 2 and 3, the coil assembly comprises a single coil. In an embodiment, the electromagnetic actuator according to the present invention, may however have a coil assembly comprising multiple coils.

Figure 8:
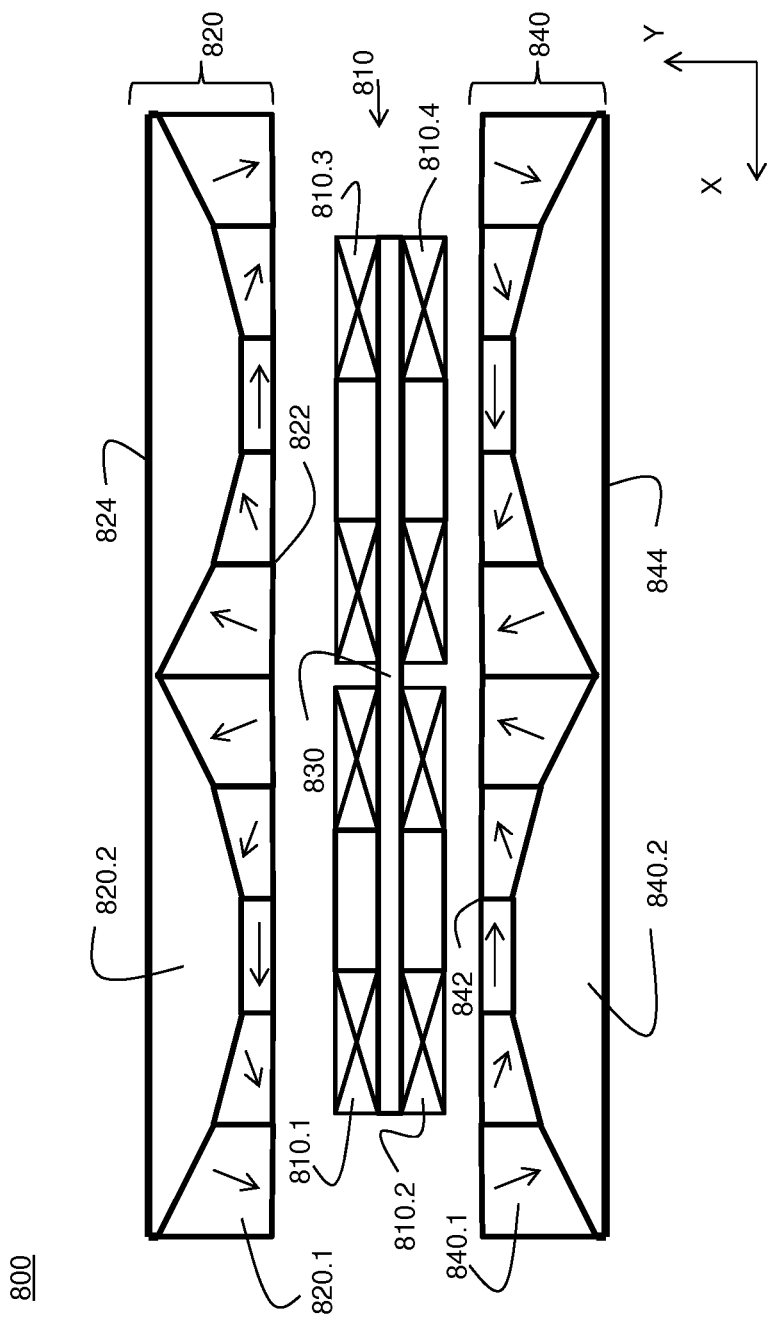
FIG. 8 depicts a cross-sectional view of a third embodiment of an actuator according to the invention.

FIG. 8 schematically shows a cross-sectional view of such an actuator. The actuator 800 as schematically shown in FIG. 8 comprises a first magnet assembly 820 and a second magnet assembly 840, each magnet assembly comprising an array of permanent magnets 820.1, 840.1 and a ferromagnetic member 820.2, 840.2 respectively. The magnet assemblies 820 and 840 extend in the X-direction and are configured to generate a spatially varying magnet field distribution outside the magnet assemblies. The actuator 800 further comprises a coil assembly 810, at least partially arranged in the magnetic field distribution, and comprising four coils 810.1, 810.2, 810.3, 810.4. In an embodiment, the coils may e.g. be connected in series. In the embodiment as shown, the coils are mounted to a member 830 which may e.g. be a cooling member. In the embodiment as shown, the arrays of permanent magnets and the ferromagnetic members of each magnet assembly extend in the X-direction and have a varying thickness in the Y-direction, perpendicular to the X-direction, along the X-direction. The thickness variation of the arrays of permanent magnets and the ferromagnetic members is such that a combined thickness of the permanent magnet array and the ferromagnetic member along the X-direction is substantially constant. In the embodiment as shown, the permanent magnet arrays have a substantially flat surface 822, 842 facing the coil assembly 810, the ferromagnetic members 820.2 and 840.2 have an outer substantially flat surface 824, 844.

In an embodiment, the electromagnetic actuator according to the present invention may e.g. be applied for positioning an object, such as a substrate or a patterning device, that is mounted to an object table. Typically, an electromagnetic actuator is used to position an object over a comparatively short operating range. In order to displace and object, such as a substrate or a patterning device, that is mounted to an object table over a comparatively large distance, use can be made of one or more linear motors or planar motors according to the present invention.

Figure 9:
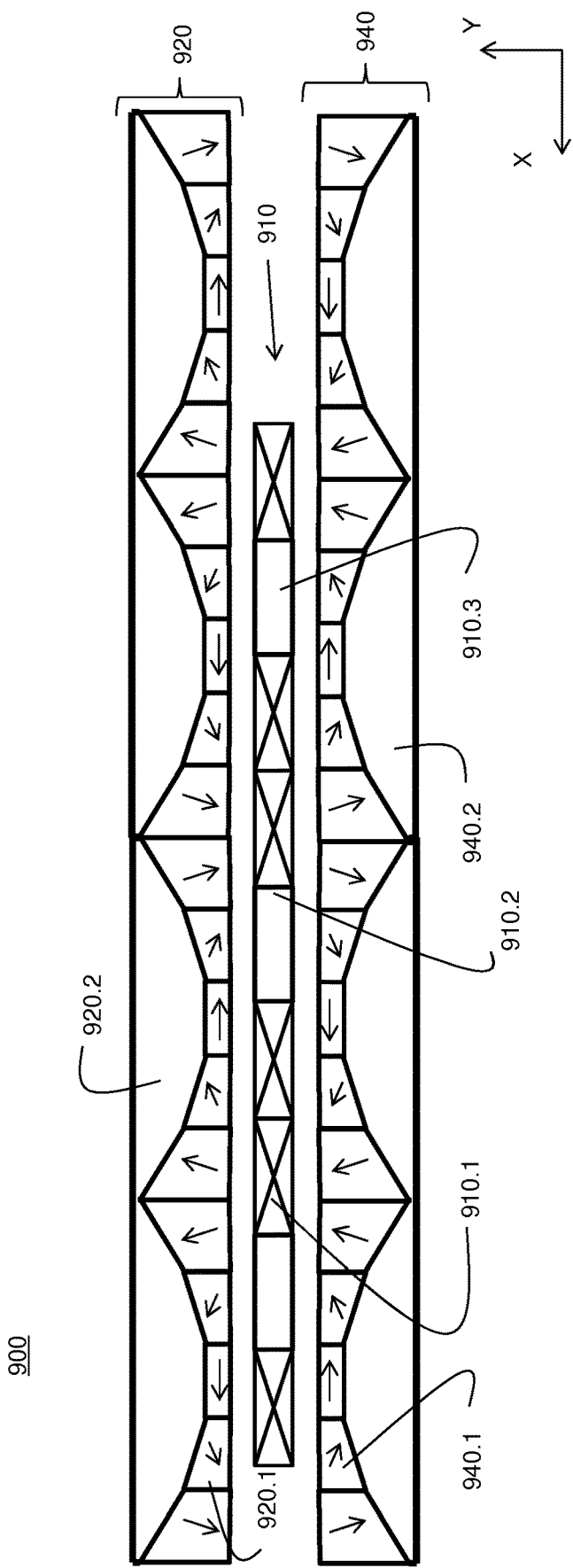
FIG. 9 depicts a cross-sectional view of a linear motor according to the invention.

FIG. 9 schematically shows a cross-sectional view of a linear motor 900 according to an embodiment of the present invention. The linear motor 900 as schematically shown in FIG. 9 comprises a first magnet assembly 920 and a second magnet assembly 940, each magnet assembly comprising an array of permanent magnets 920.1, 940.1 and a ferromagnetic member 920.2, 940.2 respectively. In the embodiment as shown, the arrays of permanent magnets and the ferromagnetic members of each magnet assembly extend in the X-direction and have a varying thickness in the Y-direction, perpendicular to the X-direction, along the X-direction. The thickness variation of the arrays of permanent magnets and the ferromagnetic members is such that a combined thickness of the permanent magnet array and the ferromagnetic member along the X-direction is substantially constant. The linear motor 900 further comprises a coil assembly 910 comprising a set of three coils 910.1, 910.2, 910.3, arranged in the X-direction and configured to be supplied by the three phase power supply. In general, the coil assembly of the linear motor according to the present invention may comprise a plurality of coils arranged to be supplied or powered by a multi-phase power supply or by separate power supplies per coil or set of coils.

In an embodiment, the present invention provides in a planar motor, e.g. for displacing an object such as a substrate or patterning device in a two-dimensional plane.

Figure 10:
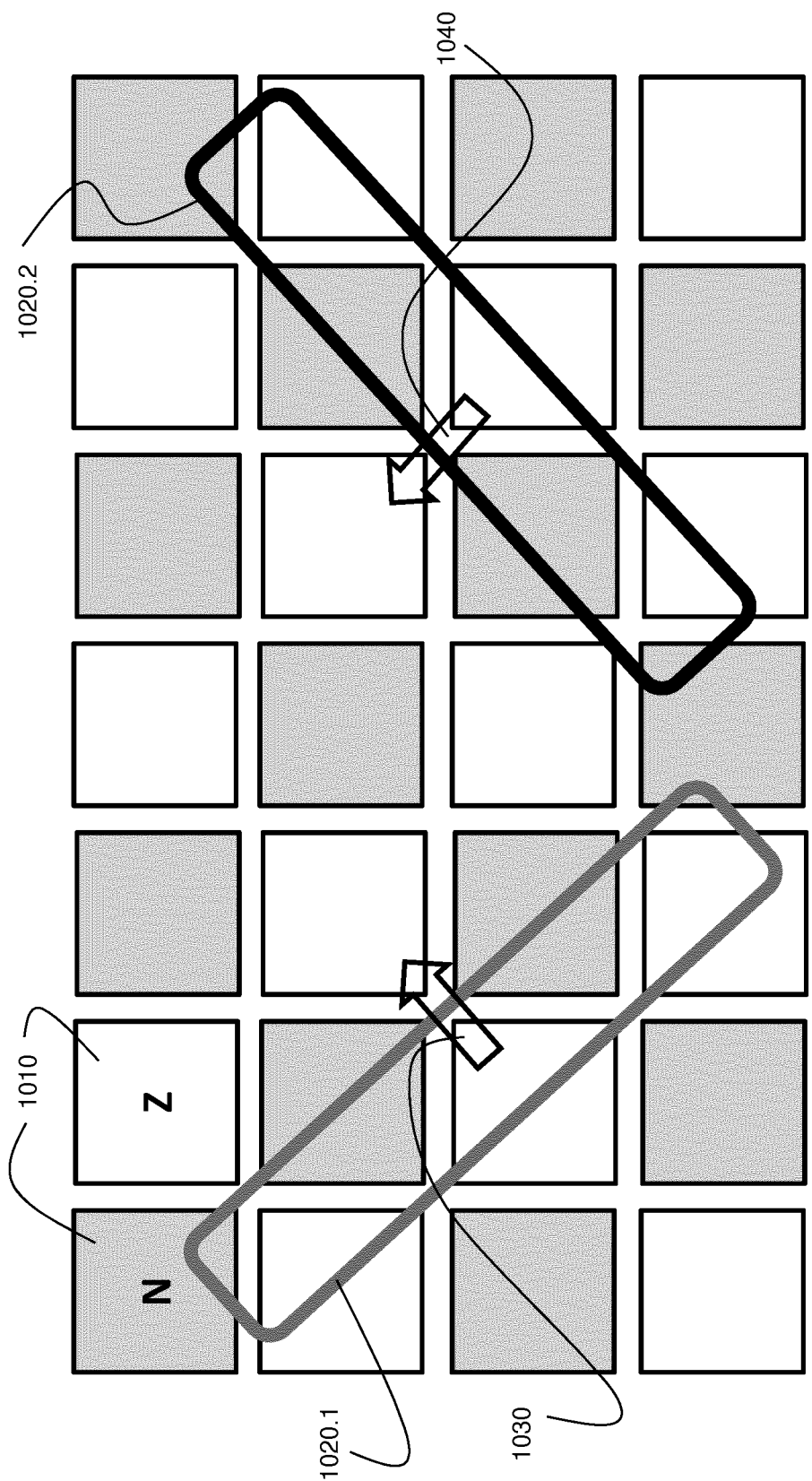
FIG. 10 depicts a top view of a planar motor as known in the art.

FIG. 10 schematically shows a top view of a conventional planar motor, the motor comprising a two-dimensional array of permanent magnets 1010, arranged in a checkerboard pattern of spatially alternating magnetic polarizations, indicated by N and Z. The motor further comprising a coil assembly comprising a first coil 1020.1 configured to co-operate with the permanent magnet array to generate a force in a first force direction, indicated by the arrow 1030 and a second coil 1020.2 configured to co-operate with the permanent magnet array to generate a force in a second force direction, indicated by the arrow 1040.

FIG. 11 schematically shows, on the left part, a top view of an electromagnetic planar motor according an embodiment of the present invention. In the embodiment as shown, the planar motor comprises:
  a magnet assembly comprising:
    a two-dimensional array of permanent magnets 1110 arranged in a first direction, X-direction and in a second direction, Y-direction, and configured to generate, outside the magnet assembly, a spatially varying magnetic field distribution in the first direction and in the second direction;
    a ferromagnetic member 1120, shown in the cross-sectional views A-A, B-B and through line 1160, on the right part and bottom part of the FIG. 11, onto which the array of permanent magnets is mounted;
  In the embodiment as shown so-called Halbach magnets that are arranged in between the magnet portions 1110.1 are not shown for clarity. In the embodiment as shown, each magnet portion 1110.1 comprise 5 magnets mounted to the ferromagnetic member 1120. In the cross-sectional views A-A and B-B, the thickness variation, in the Z-direction, of the permanent magnet array and the ferromagnetic member is schematically shown.
  In accordance with the present invention, the planar motor further comprises a coil assembly, at least partly arranged in the spatially varying magnetic field distribution, and configured to co-operate with the magnet assembly to generate an electromagnetic force, the coil assembly comprising:
  a first plurality of coils arranged to generate a force in a first force direction and configured to be powered by a first multiphase power supply;
  a second plurality of coils arranged to generate a force in a second force direction and configured to be powered by a second multiphase power supply FIG. 11 schematically shows a coil 1130 of the first plurality of coils, the coil being configured to generate a force in a first force direction, indicated by the arrow 1140. For clarity, the second plurality of coils is not shown.

In accordance with the present invention, a thickness of the two-dimensional array of permanent magnets in a third direction (Z-direction) perpendicular to the first direction (X-direction) and to the second direction (Y-direction) varies along the first direction between a minimum magnet thickness at one or more first positions along the first direction and a maximum magnet thickness at one or more second positions along the first direction;
  a thickness of the two-dimensional array of permanent magnets in the third direction varies along the second direction between the minimum magnet thickness at one or more third positions along the second direction and the maximum magnet thickness at one or more fourth positions along the second direction;
  a thickness of the ferromagnetic member in the third direction varies along the first direction between a minimum member thickness at the one or more second positions and a maximum member thickness at the one or more first positions, and
  wherein a thickness of the ferromagnetic member in the third direction varies along the second direction between a minimum member thickness at the one or more fourth positions and a maximum member thickness at the one or more third positions,
  whereby the sum of the maximum magnet thickness and the minimum member thickness at the one or more second positions is smaller than or equal to the sum of the minimum magnet thickness and the maximum member thickness at the one or more first positions and
  whereby the sum of the maximum magnet thickness and the minimum member thickness at the one or more fourth positions is smaller than or equal to the sum of the minimum magnet thickness and the maximum member thickness at the one or more third positions.

The first, second, third and fourth positions referred to are indicate in FIG. 11 as respectively x1, x2, x3, x4.

The bottom portion of FIG. 11 schematically shows a cross-sectional view along line 1160, indicating the permanent magnets with their magnetization direction indicated by the arrows and the ferromagnetic member 1120. In the cross-sectional view, the Halbach magnets 1170 of the permanent magnet array are shown as well.

In the cross-sectional view, the third and fourth positions x3 and x4 are indicated as well. As can be seen, the thickness of the permanent magnet array varies along the Y-direction between a minimum value, occurring at the x4 position and a maximum value occurring at the x3 positions. Similarly, the thickness of the ferromagnetic member 1120 varies along the Y-direction between a minimum value, occurring at the x3 position and a maximum value occurring at the x4 positions.

Note that a similar cross-sectional view would be obtained through the first and second positions x1 and x2, i.e. a cross-sectional view through line 1162.

In such embodiment, the first and second direction may e.g. form a horizontal plane. By appropriate powering of the first and second plurality of coils, an object table connected to the coil assembly may e.g. be positioned along the horizontal plane. In such arrangement, the magnet assembly may e.g. be mounted to a base, whereas the coil assembly and object table is positioned on top of the magnet assembly. In such embodiment, the magnet assembly may e.g. extend over a comparatively large area, e.g. 1×2 meter, to allow an object table, e.g. provided with a substrate, to be displaced over comparatively large distances.

Alternatively, the coil assembly may be configured to be mounted to the base and the magnet assembly, connected to an object table to be positioned, may be positioned on top of the coil assembly. Such an arrangement may in general be referred to as a moving magnet planar motor. Such an arrangement provides in the advantage that no power lines, for powering the planar motor, need to be provided to the moving portion of the motor, i.e. the portion to which the object table is connected.

The electromagnetic actuator, linear motor or planar motor provides in the advantage that, when the volume of the magnet assembly is maintained, an increased flux density of magnetic field strength can be realized outside the magnet assembly, thus enabling to generate a larger force per unit current. Alternatively, when applying an actuator or motor according to the present invention, the same force per unit current may be generated with a smaller and/or lighter magnet assembly or coil assembly. In case the magnet assembly is connected to the object that is to be displaced, it may be advantageous to reduce the weight of the magnet assembly while maintaining the force per unit current. Because of the reduced weight of the magnet assembly, such a force will result in a larger acceleration of the object.

By varying the thickness of both the permanent magnet array and the ferromagnetic member of the actuator, linear motor or planar motor according to the present invention, an improved performance of the actuator or motor is obtained. In the present invention, the thickness of both the permanent magnet array and the ferromagnetic member is varied in such manner that the magnet thickness is at a maximum where a comparatively low magnetic flux density would occur when the ferromagnetic member would have a constant thickness and the magnet thickness is minimized where a comparatively high magnetic flux density would occur when the ferromagnetic member would have a constant thickness.

As such, starting from an actuator having an array of permanent magnets and a ferromagnetic member, both having a constant thickness along the first direction (see e.g. FIG. 4), the invention can be understood as exchanging a portion of the ferromagnetic member by permanent magnet portion at those locations where a comparatively low magnetic flux density would occur and exchanging a portion of the permanent magnet array member by a ferromagnetic portion at those locations where a comparatively high magnetic flux density would occur. As a result, the volume and mass remains substantially the same, while the flux density of the spatially varying magnetic field distribution outside the magnet assembly increases.

Upon review of the magnetic flux distributions or a magnet assembly of an actuator of a motor, one can recognize that there is a relationship between the flux density in the ferromagnetic member at a particular location along the first direction and the magnetization direction of a permanent magnet present at that location along the first direction, as e.g. explained with reference to FIGS. 4 and 5. As such, for a given array of permanent magnets, the magnets have a known magnetization, one can apply one or more of the following design rules to arrive at a required or desired variation of the thickness of either the array of permanent magnets or the ferromagnetic member (the magnetization is considered a vector representing the direction and amplitude of the magnetic field generated by the permanent magnet):

A thickness of a permanent magnet of the array of permanent magnets may be selected to be proportional to an amplitude of a component of the magnetization of the permanent magnet along the second direction, i.e. a magnet having a large magnetization component along the second direction may be comparatively thick. Note that the magnetization component refers to a projection of the magnetization or magnetization vector onto the first or second direction.

A thickness of a permanent magnet of the array of permanent magnets may be selected to be inverse proportional to an amplitude of a magnetization component of the permanent magnet along the first direction.

A thickness of the ferromagnetic member at a position along the first direction may be selected to be proportional to an amplitude of a magnetization component of the permanent magnet along the first direction, i.e. at positions along the first direction where magnets have a comparatively large magnetic component along the first direction (e.g. Halbach magnets), the ferromagnetic member should be comparatively thick.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV)

radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An electromagnetic actuator comprising:
    a magnet assembly comprising:
        an array of permanent magnets arranged in a first direction and configured to generate, outside the magnet assembly, a spatially varying magnetic field distribution in the first direction; and
        a ferromagnetic member onto which the array of permanent magnets is mounted and configured to guide the magnetic flux generated by the array of permanent magnets; and
    a coil assembly, at least partly arranged in the spatially varying magnetic field distribution, configured to cooperate with the magnet assembly to generate an electromagnetic force;
    wherein a thickness of the array of permanent magnets in a second direction perpendicular to the first direction varies along the first direction between a minimum magnet thickness at one or more first positions along the first direction and a maximum magnet thickness at one or more second positions along the first direction, and wherein a thickness of the ferromagnetic member in the second direction varies along the first direction between a minimum member thickness at the one or more second positions and a maximum member thickness at only the one or more first positions, whereby the sum of the maximum magnet thickness and the minimum member thickness at the one or more second positions is smaller than or equal to the sum of the minimum magnet thickness and the maximum member thickness at the one or more first positions.

2. The electromagnetic actuator according to claim 1, wherein a combined thickness of the array of permanent magnets and the ferromagnetic member in the second direction is substantially constant along the first direction.

3. The electromagnetic actuator according to claim 1, wherein the array of permanent magnets comprises a Halbach array of permanent magnets.

4. The electromagnetic actuator according to claim 1, wherein an outer surface of the array of permanent magnets facing the coil assembly is a substantially flat surface.

5. The electromagnetic actuator according to claim 1, wherein an outer surface of the ferromagnetic member perpendicular to the second direction is a substantially flat surface.

6. The electromagnetic actuator according to claim 1, wherein the thickness of the array of permanent magnets varies continuously along the first direction.

7. The electromagnetic actuator according to claim 6, wherein the thickness of the array of permanent magnets varies piecewise linear along the first direction.

8. The electromagnetic actuator according to claim 1, wherein the permanent magnet array comprises a first and a second permanent magnet that are substantially magnetized in the second direction and a third permanent magnet that is substantially magnetized in the first direction and is arranged in between the first and the second permanent magnet, a thickness of the third permanent magnet being smaller than a thickness of the first permanent magnet and a thickness of the second permanent magnet.

9. The electromagnetic actuator according to claim 1, wherein a thickness of a permanent magnet of the array of permanent magnets is proportional to an amplitude of a magnetization component of the permanent magnet along the second direction.

10. The electromagnetic actuator according to claim 1, wherein a thickness of a permanent magnet of the array of permanent magnets is inversely proportional to an amplitude of a magnetization component of the permanent magnet along the first direction.

11. The electromagnetic actuator according to claim 1, further comprising a further magnet assembly, arranged on an opposite side of the coil assembly.

12. The electromagnetic actuator according to claim 11, wherein the further magnet assembly is configured to cooperate with the magnet assembly to generate the spatially varying magnet field distribution along the first direction.

13. The electromagnetic actuator according to claim 11, wherein the coil assembly is at least partly arranged in a space between the magnet assembly and the further magnet assembly.

14. The electromagnetic actuator according to claim 11, wherein the further magnet assembly comprises:
    a further array of permanent magnets arranged in a first direction and configured to generate, outside the further magnet assembly, a spatially varying magnetic field distribution in the first direction; and
    a further ferromagnetic member onto which the further array of permanent magnets is mounted;
    wherein a thickness of the further array of permanent magnets in a second direction, perpendicular to the first direction, varies along the first direction between the minimum magnet thickness at the first position along the first direction and the maximum magnet thickness at the second position along the first direction and wherein a thickness of the further ferromagnetic member in the second direction varies along the first direction between the minimum member thickness at the second position and the maximum member thickness at the first position.

15. The electromagnetic actuator according to claim 1, wherein the one or more first positions and the one or more second positions are alternatingly arranged along the first direction.

16. The electromagnetic actuator according to claim 1, wherein a position of an interface between the array of permanent magnets and the ferromagnetic member in the second direction varies along the first direction.

17. An electromagnetic linear motor comprising:
    a magnet assembly comprising:
        an array of permanent magnets arranged in a first direction and configured to generate, outside the magnet assembly, a spatially varying magnetic field distribution in the first direction; and a ferromagnetic member onto which the array of permanent magnets is mounted and configured to guide the magnetic flux generated by the array of permanent magnets; and a coil assembly, at least partly arranged in the spatially varying magnetic field distribution, configured to cooperate with the magnet assembly to generate an electromagnetic force, the coil assembly comprising a plurality of coils arranged in the first direction and configured to be powered by a multiphase power supply;

wherein a thickness of the array of permanent magnets in a second direction perpendicular to the first direction varies along the first direction between a minimum magnet thickness at one or more first positions along the first direction and a maximum magnet thickness at one or more second positions along the first direction and wherein a thickness of the ferromagnetic member in the second direction varies along the first direction between a minimum member thickness at the one or more second positions and a maximum member thickness at the one or more first positions, whereby the sum of the maximum magnet thickness and the minimum member thickness at the one or more second positions is smaller than or equal to the sum of the minimum magnet thickness and the maximum member thickness at the one or more first positions.

18. An electromagnetic planar motor comprising:
a magnet assembly comprising:
  a two-dimensional array of permanent magnets arranged in a first direction and in a second direction and configured to generate, outside the magnet assembly, a spatially varying magnetic field distribution in the first direction and in the second direction; and
  a ferromagnetic member onto which the array of permanent magnets is mounted and configured to guide the magnetic flux generated by the array of permanent magnets; and
a coil assembly, at least partly arranged in the spatially varying magnetic field distribution, configured to cooperate with the magnet assembly to generate a force, the coil assembly comprising:
  a first plurality of coils arranged in the first direction and configured to be powered by a first multiphase power supply; and
  a second plurality of coils arranged in the second direction and configured to be powered by a second multiphase power supply;
wherein a thickness of the two-dimensional array of permanent magnets in a third direction perpendicular to the first direction and to the second direction varies along the first direction between a minimum magnet thickness at one or more first positions along the first direction and a maximum magnet thickness at one or more second positions along the first direction;
wherein a thickness of the two-dimensional array of permanent magnets in the third direction varies along the second direction between the minimum magnet thickness at one or more third positions along the second direction and the maximum magnet thickness at one or more fourth positions along the second direction;
wherein a thickness of the ferromagnetic member in the third direction varies along the first direction between a minimum member thickness at the one or more second positions and a maximum member thickness at the one or more first positions, and wherein a thickness of the ferromagnetic member in the third direction varies along the second direction between a minimum member thickness at the one or more fourth positions and a maximum member thickness at the one or more third positions, whereby the sum of the maximum magnet thickness and the minimum member thickness at the one or more second positions is smaller than or equal to the sum of the minimum magnet thickness and the maximum member thickness at the one or more first positions, and whereby the sum of the maximum magnet thickness and the minimum member thickness at the one or more fourth positions is smaller than or equal to the sum of the minimum magnet thickness and the maximum member thickness at the one or more third positions.

19. The electromagnetic planar motor according to claim 18, wherein
a combined thickness of the two-dimensional array of permanent magnets and the ferromagnetic member in the third direction is substantially constant along the first direction and along the second direction.

20. The electromagnetic planar motor according to claim 18, wherein the one or more first positions and the one or more second positions are alternatingly arranged along the first direction and wherein the one or more third positions and the one or more fourth positions are alternatingly arranged along the second direction.

21. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
an electromagnetic actuator according to claim 1.

22. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and
an electromagnetic linear motor according to claim 17 for positioning the support or the substrate table.

23. A lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate; and an electromagnetic planar motor according to claim 18 for positioning the support or the substrate table.

\* \* \* \* \*